United States Patent
Nobuki et al.

(10) Patent No.: US 8,872,167 B2
(45) Date of Patent: Oct. 28, 2014

(54) ORGANIC LIGHT-EMITTING DEVICE

(71) Applicant: Hitachi, Ltd., Tokyo (JP)

(72) Inventors: Shunichiro Nobuki, Mito (JP); Shingo Ishihara, Mito (JP)

(73) Assignee: Hitachi, Ltd., Tokyo (JP)

( * ) Notice: Subject to any disclaimer, the term of this patent is extended or adjusted under 35 U.S.C. 154(b) by 121 days.

(21) Appl. No.: 13/659,126

(22) Filed: Oct. 24, 2012

(65) Prior Publication Data
US 2013/0112953 A1    May 9, 2013

(30) Foreign Application Priority Data
Nov. 4, 2011   (JP) .................. 2011-241827

(51) Int. Cl.
*H01L 29/08*   (2006.01)
*H01L 51/52*   (2006.01)

(52) U.S. Cl.
CPC .......... *H01L 51/5271* (2013.01); *H01L 51/5246* (2013.01); *H01L 51/524* (2013.01)
USPC ............................................. 257/40; 257/98

(58) Field of Classification Search
USPC ....................................................... 257/40, 98
See application file for complete search history.

(56) References Cited

FOREIGN PATENT DOCUMENTS

| JP | 08-138870 A | 5/1996 |
|---|---|---|
| JP | 2004-146121 A | 5/2004 |

*Primary Examiner* — Douglas Menz
(74) *Attorney, Agent, or Firm* — Volpe and Koenig, P.C.

(57) ABSTRACT

An object of the present invention is to provide an organic light-emitting device, wherein light trapped in a substrate due to total reflection at the interface between air and a substrate is efficiently extracted to the air side.

The organic light-emitting device includes: a transparent electrode; a counter electrode; a light-emitting layer interposed between the transparent electrode and the counter electrode; a front substrate which allows light from the light-emitting layer to exit to the outside from a surface of the front substrate on the opposite side to the light-emitting layer side; and a diffuse reflector which reflects light from the light-emitting layer, wherein the diffuse reflector is provided on a side surface of the front substrate and at a given position on a surface thereof.

10 Claims, 3 Drawing Sheets

ORGANIC LIGHT-EMITTING DEVICE

BACKGROUND OF THE INVENTION

1. Field of the Invention

The present invention relates to an organic light-emitting device and a light source device using an organic light-emitting device.

2. Background Art

As a related art, Patent document 1 (JP-A-2004-146121) discloses the following technique. That is, the technique aims to provide an organic electroluminescent device in which the leakage of light guided in a transparent substrate from a side surface of a transparent substrate and the extinction of the light inside the device can be prevented, and the light extraction efficiency is high. The technique relates to an organic electroluminescent device which is formed by providing an organic light-emitting layer between two electrodes and has a light-emitting section that allows the organic light-emitting layer to emit light by applying a voltage between the two electrodes. The organic electroluminescent device is configured such that a transparent electrode among the two electrodes is formed on a surface of a transparent substrate, a light reflection section is provided in an inner portion or an end portion of the transparent substrate at a position surrounding the light-emitting section, and even if light emitted from the light-emitting section is totally reflected at the interface between the surface of the transparent substrate and air and is guided in the transparent substrate, the guided light can be extracted from the surface of the transparent substrate by reflecting the guided light by the light reflection section.

Further, Patent document 2 (JP-A-8-138870) discloses the following technique. That is, the technique aims to provide an organic thin-film EL device in which a specular electrode of an organic thin-film EL element is hardly visually recognized as a specular surface also when the element does not emit light. The organic thin-film EL device is configured such that the device includes: an organic thin-film EL element having a laminate obtained by laminating a transparent substrate, a transparent electrode formed on one principal surface of the transparent substrate, and a specular electrode formed on the transparent electrode with at least an organic light-emitting layer interposed therebetween; and a reflection section which covers the organic thin-film EL element and the transparent substrate except for a portion of a side surface of the transparent substrate, and light emitted from the organic thin-film EL element is emitted to the outside from the portion which is not covered with the reflection section among the side surfaces of the transparent substrate.

However, in the configuration described in Patent document 1, the reflector is formed only in a side surface and an inner portion of the substrate, and therefore, part of light reflected by the reflector exits ahead of the substrate to contribute to the improvement of the light extraction efficiency, however, on the other hand, part of light propagates behind the substrate to directly become a loss, and therefore, it is difficult to efficiently extract light trapped in the substrate. Further, in the configuration described in Patent document 2, light is extracted only from the side surface, and therefore, the multiple reflection loss of light accompanying the propagation of light in the device is large, and it is difficult to extract a sufficient amount of light to the outside.

SUMMARY OF THE INVENTION

The invention has its object to efficiently extract light trapped in a substrate due to total reflection at the interface between air and a substrate to the air side.

A feature of the invention for achieving the above object is as follows. In an organic light-emitting device including: a transparent electrode; a counter electrode; a light-emitting layer interposed between the transparent electrode and the counter electrode; a front substrate which allows light from the light-emitting layer to exit to the outside from a surface of the front substrate on the opposite side to the light-emitting layer side; and a diffuse reflector which reflects light from the light-emitting layer, the diffuse reflector is provided on a side surface of the front substrate and at a given position on a surface thereof.

According to the invention, in an organic light-emitting device and a light source device using the same, light trapped in a substrate due to total reflection at the interface between air and a substrate can be efficiently extracted to the air side. Objects other than the above-described object, configurations, and advantages can be understood by the following description of embodiments.

DESCRIPTION OF THE PREFERRED EMBODIMENTS

Hereinafter, embodiments of the invention will be described with reference to the accompanying drawings, etc. The following embodiments are given to show specific examples of the contents of the invention of this application, and the invention of this application is not limited to these embodiments, and the embodiments can be variously altered and modified by those skilled in the art within a range of a technical idea disclosed in this specification. In all the drawings for describing the embodiments, members having the same function are denoted by the same reference numeral and the repetitive description thereof will be omitted.

Figure 1:
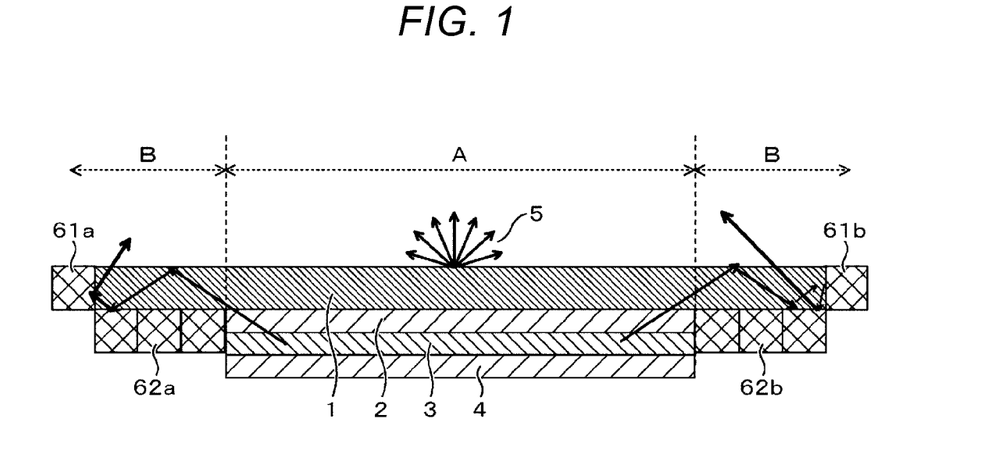
FIG. 1 is a view showing an exemplary organic light-emitting device according to an embodiment of the invention.
Figure 2:
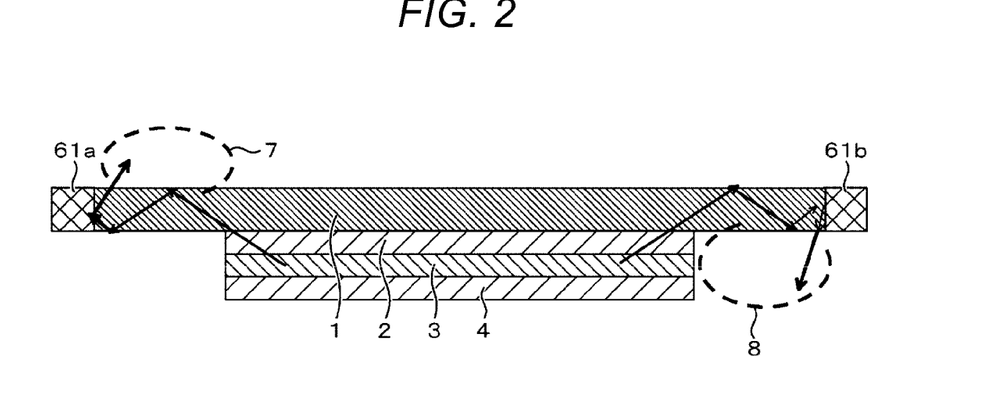
FIG. 2 is a view illustrating the propagation of light in a structure of the related art to be compared with the organic light-emitting device shown in FIG. 1.

FIG. 1 is a view showing an exemplary organic light-emitting device according to an embodiment of the invention. FIG. 2 is a view illustrating the propagation of light in a structure of the related art to be compared with the organic light-emitting device shown in FIG. 1. A transparent electrode 2 is provided as an anode on a surface of a front substrate 1, an organic light-emitting layer 3 is laminated on a surface of the transparent electrode 2, and further, a counter electrode 4 is provided as a cathode on a surface of the organic light-emitting layer 3, and an organic light-emitting element is formed by using the resulting article as a basic structure.

As materials for the respective layers constituting the organic light-emitting element, known conventionally used materials can be appropriately used.

Front Substrate

As the front substrate 1, a transparent glass plate made of soda-lime glass, alkali-free glass, or the like, or a transparent plastic plate made of an acrylic resin, a PET resin, a PEN resin, a cycloolefin resin, an olefin resin, a carbonate resin, a nylon resin, a fluorine resin, a silicone resin, a polyimide resin, a polysulfone resin, or the like can be used. The front substrate 1 may be any as long as it has light transmissibility, and a slightly colored one may be used other than a colorless transparent one. In particular, one which transmits light with a wavelength of from 380 to 780 nm is preferred. Further, the refractive index of the front substrate 1 is not particularly limited, but is preferably 1.6 or more. By using the front substrate 1 having a refractive index of 1.6 or more, the total reflection occurring at the interface between the transparent electrode 2 and the front substrate 1 at which the refractive index changes can be prevented, and light which is guided in the transparent electrode 2 and lost can be extracted to the front substrate 1, and therefore, the effect of the invention that light trapped in the substrate is extracted to air can be further improved. As the front substrate 1 having a high refractive index, for example, a high-refractive index glass containing antimony, zinc, zirconium, tantalum, tungsten, lead, or the like, a plastic having a refractive index increased by the introduction of chlorine, bromine, iodine, sulfur, or the like, a plastic having a refractive index increased by crystallization through stretching, or the like can be used. Specific examples of a commercially available product include a variety of optical glasses manufactured by Sumita Optical Glass, Inc.

Transparent Electrode

The transparent electrode 2 formed as an anode is an electrode for injecting holes into the organic light-emitting layer 3. As the transparent electrode 2 (anode), an electrode material composed of a metal, an alloy, an electroconductive compound, or a mixture thereof, each having a high work function is preferably used, and particularly, an electrode material having a work function of 4 eV or more is preferably used. Specific examples of such an electrode material include metals such as gold and conductive transparent materials such as CuI, ITO (indium tin oxide), $SnO_2$, ZnO, and IZO (indium zinc oxide). For example, by depositing such an electrode material on the front substrate 1 using a vacuum deposition method, a sputtering method, a CVD method, an ion plating method, a coating method, or the like, the transparent electrode 2 (anode) in the form of a thin film can be formed. The light transmittance of the transparent electrode 2 (anode) is preferably 80% or more. Further, the sheet resistance of the transparent electrode 2 (anode) is preferably several hundreds Ω/sq. or less, particularly preferably 100 Ω/sq. or less. Further, in order to control the properties of the transparent electrode 2 (anode) such as transparency and conductivity as described above, the film thickness of the transparent electrode 2 (anode) is set to 80 to 400 nm, more preferably 100 to 200 nm, although it varies depending on the material thereof.

Organic Light-Emitting Layer

The organic light-emitting layer 3 is composed of a hole transport layer, a light-emitting layer, an electron transport layer, a buffer layer, and the like. However, the organic light-emitting layer may not have a hole transport layer, an electron transport layer, or a buffer layer as long as it has at least a light-emitting layer. Further, the organic light-emitting layer may have a hole injection layer or an electron injection layer, which will be described later, in some cases.

The hole transport layer has a function of transporting holes and injecting the holes into the light-emitting layer. Therefore, the hole transport layer is preferably composed of a hole transport material having a high hole mobility. Further, it is preferred that the hole transport layer is chemically stable and has a low ionization potential, a low electron affinity, and a high glass transition temperature. As a material of the hole transport layer, for example, N,N'-bis(3-methylphenyl)-N, N'-diphenyl-[1,1'-biphenyl]-4,4'-diamine (TPD), 4,4'-bis[N-(1-naphthyl)-N-phenylamino]biphenyl (α-NPD), 4,4',4"-tri (N-carbazolyl)triphenylamine (TCTA), 1,3,5-tris[N-(4-diphenylaminophenyl)phenylamino]benzene (p-DPA-TDAB), 4,4',4"-tris(N-carbazol)triphenylamine (TCTA), 1,3, 5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4',4"-tris[1-naphthyl(phenyl)amino]triphenylamine (1-TNATA), 4,4',4"-tris[2-naphthyl(phenyl)amino]triphenylamine (2-TNATA), 4,4',4"-tris[biphenyl-4-yl-(3-methylphenyl)amino]triphenylamine (p-PMTDATA), 4,4',4"-tris[9,9-dimethylfluorene-2-yl(phenyl)amino]triphenylamine (TFATA), 4,4',4"-tris(N-carbazoyl)triphenylamine (TCTA), 1,3,5-tris[N-(4-diphenylaminophenyl)phenylamino]benzene (p-DPA-TDAB), 1,3,5-tris{4-[methylphenyl(phenyl)amino]phenyl}benzene (MTDAPB), N,N'-di(biphenyl-4-yl)-N,N'-diphenyl[1,1'-biphenyl]-4,4'-diamine (p-BPD), N,N'-bis(9,9-dimethylfluorene-2-yl)-N,N'-diphenylfluorene-2,7-diamine (PFFA), N,N, N',N'-tetrakis(9,9-dimethylfluoren-2-yl)-[1,1-biphenyl]-4, 4'-diamine (FFD), (NDA)PP, 4-4'-bis[N,N'-(3-tollyl)amino]-3-3'-dimethylbiphenyl (HMTPD), etc. are preferred, and these may be used alone or in combination of two or more of them.

A hole injection layer may be disposed between the transparent electrode 2 serving as an anode and the hole transport layer as needed. The hole injection layer is preferably formed from a material having an appropriate ionization potential so as to reduce a hole injection barrier between the anode and the hole transport layer. Further, it is preferred that the hole injection layer plays a role in burying the unevenness of a surface of an under layer. Examples of the material of the hole injection layer include copper phthalocyanine, a star burst amine compound, polyaniline, polythiophene, vanadium oxide, molybdenum oxide, ruthenium oxide, and aluminum oxide.

The hole transport material may contain an oxidant. By incorporating an oxidant in the hole transport material, the barrier between the anode and the hole transport layer can be reduced, or the electroconductivity can be improved. Examples of the oxidant include Lewis acid compounds such as ferric chloride, ammonium chloride, gallium chloride, indium chloride, and antimony pentachloride, electron accepting compounds such as trinitrofluorene, and compounds listed as the material of the hole injection layer such as vanadium oxide, molybdenum oxide, ruthenium oxide, and aluminum oxide, and these may be used alone or in combination of two or more of them.

As a luminescent organic compound to be used in the light-emitting layer, an arbitrary known compound can be used, and examples thereof include anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complexes, tris(8-hydroxyquinolinate)aluminum complexes, tris(4-metal-8-quinolinate)aluminum complexes, tris(5-phenyl-8-quinolinate)aluminum complexes, aminoquinoline metal complexes, benzoquinoline metal complexes, tri-(p-terphenyl-4-yl) amine, 1-aryl-2,5-di(2-thienyl)pyrrole derivatives, pyran, quinacridone, rubrene, distyrylbenzene derivatives, distyrylarylene (DSA) derivatives, and compounds having such a luminescent organic compound in the molecule, however, it is not limited thereto. Further, not only compounds derived from fluorescent pigments typified by these compounds, but also materials capable of phosphorescence emission from a state of triplet and compounds having a group derived from such a material in a part of the molecule can also be preferably used.

The electron transport layer has a function of transporting electrons and injecting the electrons into the light-emitting layer. Therefore, the electron transport layer is preferably composed of an electron transport material having a high electron mobility. As a material of the electron transport layer, for example, tris(8-quinolinol) aluminum, an oxadiazole derivative, a silole derivative, a zinc benzothiazole complex, basocuproin (BCP), etc. are preferred, and these compounds may be used alone or in combination of two or more of them.

Further, it is preferred that the electron transport layer is configured such that the electron transport material contains a reducing agent to reduce a barrier between the buffer layer and the electron transport layer or to improve the electroconductivity of the electron transport layer. Examples of the reducing agent include alkali metals, alkaline earth metals, alkali metal oxides, alkaline earth oxides, rare earth oxides, alkali metal halides, alkaline earth halides, rare earth halides, and complexes formed with an alkali metal, an aromatic compound, or the like. Particularly preferred alkali metals are Cs, Li, Na, and K. The reducing agent is not limited to these materials, and these materials may be used alone or in combination of two or more of them.

Further, the electron injection layer may be inserted between the counter electrode 4 or the buffer layer and the electron transport layer to improve the electron injection efficiency. As a material of the electron injection layer, for example, lithium fluoride, magnesium fluoride, calcium fluoride, strontium fluoride, barium fluoride, magnesium oxide, aluminum oxide, etc. are preferred. The electron injection layer is not limited to these materials, and these materials may be used alone or in combination of two or more of them.

[Counter Electrode]

The counter electrode 4 formed as a cathode is an electrode for injecting electrons into the organic light-emitting layer 3. As the counter electrode 4 (cathode), an electrode material composed of a metal, an alloy, an electroconductive compound, or a mixture thereof, each having a low work function is preferably used, and particularly, an electrode material having a work function of 5 eV or less is preferably used. As such an electrode material, an alkali metal, an alkali metal halide, an alkali metal oxide, an alkaline earth metal, a rare earth element, an alloy thereof with another metal, or the like can be used, and examples thereof include sodium, sodium-potassium alloys, lithium, magnesium, aluminum, magnesium/silver mixtures, magnesium/indium mixtures, aluminum-lithium alloys, $Al/Al_2O_3$ mixtures, and Al/LiF mixtures. The counter electrode 4 (cathode) can be produced by, for example, depositing such an electrode material using a vacuum deposition method, a sputtering method, or the like to form a thin film, and the light transmittance of the counter electrode 4 (cathode) is preferably 10% or less. In order to control the properties of the counter electrode 4 (cathode) such as light transmittance as described above, the film thickness of the counter electrode 4 (cathode) is set to generally 500 nm or less, preferably in a range of from 100 to 200 nm, although it varies depending on the material thereof.

By applying a positive voltage to the transparent electrode 2 (anode) and applying a negative voltage to the counter electrode 4 (cathode), electrons and holes injected into the organic light-emitting layer 3 are recombined in the organic light-emitting layer 3 to emit light. The light emitted from the organic light-emitting layer 3 in this manner passes through the transparent electrode 2 (anode) and the front substrate 1 to become externally extracted light 5. That is, light is extracted from one principal surface on the opposite side to one principal surface of the front substrate 1 on which the transparent electrode 2, the organic light-emitting layer 3, the counter electrode 4, etc. are laminated.

In this embodiment, the transparent electrode 2 is used as an anode and the counter electrode 4 is used as a cathode for the purpose of illustration, however, the reverse may be possible. That is, it is possible that the transparent electrode 2 is used as a cathode and the counter electrode 4 is used as an anode. In order to form the transparent electrode 2 as a cathode, a method of forming a thin film having a thickness of about several nanometers to several tens nanometers using the above-described aluminum, silver, or the like, which is a known cathode material, or a method of forming a thin film having a thickness of about several nanometers to several tens nanometers using a material such as an alkali metal or an alkaline earth metal, which is used in the electron injection layer, between the transparent electrode and the organic light-emitting layer can be used. Further, in order to form the counter electrode 4 as an anode, a method of imparting a hole injection property using the transparent electrode made of ITO or the like described above can be used.

In this specification, for illustrative purposes, the connection between the transparent electrode 2 or the counter electrode 4 and a power supply outside the organic light-emitting device is not specifically described, however, in order to drive the organic light-emitting device, the transparent electrode 2 and the counter electrode 4 are appropriately connected to an external power supply through a space between the diffuse reflector and the substrate or a region in which the diffuse reflector is not formed. In order to connect the transparent electrode 2 and the counter electrode 4 to an external power supply, it is necessary to provide an opening in a portion of the diffuse reflector, however, if light is released from this opening, light-emitting efficiency is decreased, which is not preferred. The organic light-emitting device of the invention of this application is configured such that light is extracted only from a principal surface of the substrate.

Here, a light-emitting region A and a non-light-emitting region B are defined as follows. A light-emitting region A is a region which performs a practical light-emitting function as the organic light-emitting device. The light-emitting region A is configured such that a substantial organic light-emitting layer is sandwiched by the transparent electrode 2 and the counter electrode 4 and is a region which emits light when a voltage is applied to the two electrodes. The region which emits light may be divided into two or more regions, and in this case, the light-emitting region A contains a region which does not emit light between a region which emits light and another adjacent region which emits light. Meanwhile, a region which is not contained in the light-emitting region A is referred to as a non-light-emitting region B.

According to the invention, in an organic light-emitting element configured to have such a layer structure, a diffuse reflector 6 is provided on the both side surfaces of the front substrate 1 and in the non-light-emitting region B on the upper or lower surface thereof.

In the embodiment shown in FIG. 1, a diffuse reflector 61*a* and a diffuse reflector 61*b* are formed on the side surfaces of the front substrate 1, and a diffuse reflector 62*a* and a diffuse reflector 62*b* are formed in the non-light-emitting region B on one principal surface of the front substrate 1 on the side where the organic light-emitting layer 3 is provided.

In the case where light emitted from the organic light-emitting layer 3 is extracted to the outside from the front substrate 1, part of the light is totally reflected at the interface between air and a surface of the front substrate 1, and light guided in the front substrate 1 is reflected by the diffuse reflector 61a or 61b and exits from the surface of the front substrate 1 to become externally extracted light 7 without causing leakage thereof from the side surface of the front substrate 1 or extinction thereof in the element. Here, by providing only the diffuse reflectors 61a and 61b, when light is diffused and reflected by the side surface of the front substrate 1, substantially half of the light is diffused and reflected in the opposite direction to a direction in which light is originally desired to be emitted as shown by the externally extracted light 5 to become leakage light 8 leaking backward. However, by also providing the diffuse reflectors 62a and 62b, such light is diffused again in the light exit direction, and therefore most of the light trapped in the substrate can be extracted to the outside, whereby efficiency of extracting light from the surface of the front substrate 1 can be increased.

In the case where the diffuse reflectors 61a, 61b, 62a, and 62b are provided on the side surfaces of the front substrate 1 and in the non-light-emitting region B in one principal surface of the substrate 1 on the side where the light-emitting layer 3 is provided, as a method for producing the diffuse reflectors 61a, 61b, 62a, and 62b, a method for forming the diffuse reflectors 61a, 61b, 62a, and 62b by fixing a reflective material to the front substrate 1 through application, sticking, deposition, adhering, etc., can be used. Alternatively, the diffuse reflectors may be formed in such a manner that a high reflecting film is combined with a diffuse transmissive portion by imparting a diffuse transmission property to the surface of the front substrate 1 by roughening the surface of the substrate through heating or a processing method such as excimer laser processing, carbon dioxide laser processing, microprocessing using an end mill, sandblast processing, or etching processing, and then, forming a film having a high reflectance, for example, forming a metal film thereon. As the substrate having a roughened surface, i.e., having a microrelief structure formed on a surface thereof, a frosted glass, a microlens, etc., can be used.

As the reflective material to be used for forming the diffuse reflectors 61a, 61b, 62a, and 62b, for example, a surface-roughened metal such as aluminum, gold, silver, or copper, particles thereof, or a foil thereof, other specular reflectance sheet, a diffuse reflection sheet, reflective film composed of a dielectric laminate film, resin particles, glass particles, hollow beads, fine particles of an inorganic material (for example, $ZrO_2$, $BaTiO_3$, or $TiO_2$, known as a high-refractive index material), a reflective paint containing such particles, or the like can be used. Alternatively, a material obtained by internally filling a filler such as titanium oxide or air bubbles in a white acrylic plate, a compression-molded white plate of barium sulfate, or a PET film may be used. In order to efficiently diffuse visible light, the particle diameter of the above particles is preferably set to a value close to the wavelength of the visible light, for example, from 100 nm to 10 μm, particularly preferably from 200 nm to 4 μm. The reflective material to be used for forming the diffuse reflectors 61a, 61b, 62a, and 62b preferably has a light diffuse reflectance in a wavelength range of from 380 to 780 nm of 90% or more. By forming the diffuse reflectors 61a, 61b, 62a, and 62b having a diffuse reflectance of 90% or more using such a reflective material, the guided light in the front substrate 1 can be effectively reflected and efficiently extracted from the surface of the front substrate 1. The diffuse reflectors 61a, 61b, 62a, and 62b preferably have a reflectance as high as possible, and ideally, the diffuse reflectors 61a, 61b, 62a, and 62b have a reflectance of 100%.

The light diffuse reflectance in a wavelength range of from 450 to 700 nm is preferably 90% or more, more preferably 95% or more. According to this configuration, the luminance of a product provided with such a diffuse reflector as a light reflector plate can be sufficiently ensured. The "diffuse reflectance" as used herein is a "diffused light reflectance excluding specular reflectance" as defined in JIS Z 8741, and is a value obtained by measuring a light reflectance in a wavelength range of from 450 to 700 nm using a self-recording spectrophotometer and calculating the reflectance as a relative value when taking the diffuse reflectance of a white plate obtained by caking fine powder of barium sulfate as 100%.

Here, it is preferred that the diffuse reflectors 62a and 62b are not formed in the light-emitting region A in the principal surface of the front substrate 1 on the side where the organic light-emitting layer 3 is provided. According to such a configuration, only light which is totally reflected to propagate at a wide angle is efficiently diffused and reflected without hindering the traveling of light which can originally propagate on the air side without being subjected to total reflection at the interface between air and the front substrate 1 among the light emitted from the light-emitting region, and the light extraction efficiency can be improved.

Figure 3:
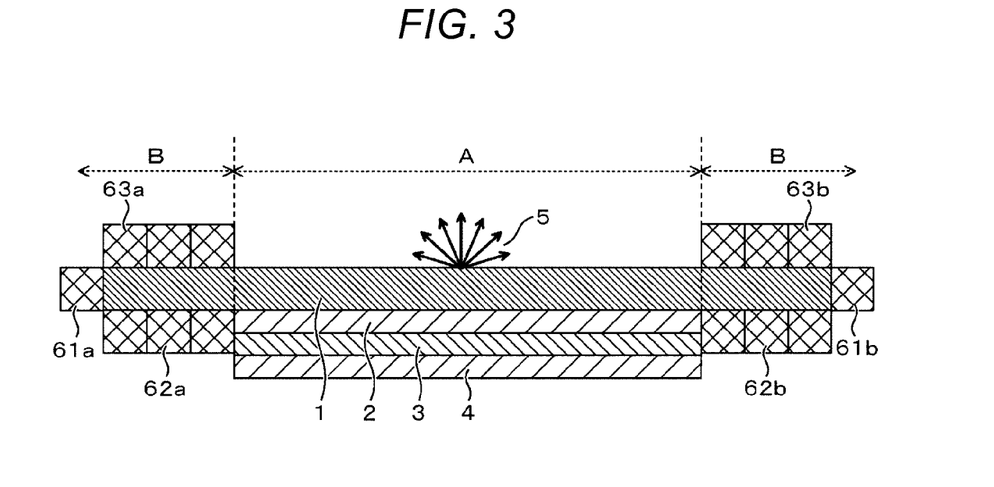
FIG. 3 is a view showing another exemplary organic light-emitting device according to an embodiment of the invention.

FIG. 3 is a view showing another exemplary organic light-emitting device according to an embodiment of the invention.

The organic light-emitting device shown in FIG. 3 is configured such that diffuse reflectors 63a and 63b are formed in the non-light-emitting region on a principal surface of the front substrate 1 on the light exit direction side (air side) in addition to the configuration of the embodiment shown in FIG. 1. According to this configuration, the amount of extracted light is further increased. The reason has not been completely elucidated yet, but it is considered that the following three effects are combined.

Firstly, light diffused and reflected from the diffuse reflectors 61a and 61b formed on the side surfaces is diffused and reflected again by the diffuse reflectors 63a and 63b formed on the light exit direction side (air side) of the front substrate 1, whereby the light diffused and reflected in a relatively wide angle direction from the diffuse reflectors 61a and 61b formed on the side surfaces can be at least partially diffused and reflected at a shallow angle. In this manner, it is considered that light emitted to the air side from the light-emitting region can be increased.

Secondarily, it is considered that the diffuse reflection probability (or diffuse reflection frequency) in an end portion of the substrate in which light propagates is increased, and therefore, light can be more reliably extracted to the air side. The reason why the light extraction efficiency is improved by increasing the diffuse reflection probability or the diffuse reflection frequency is as follows. A diffuse reflective material ideally has a perfectly diffusing property. However, in general, a diffuse reflective material does not give a perfectly diffusing surface and light is diffused more in a direction of regular reflection (specular reflection) in many cases. Therefore, one diffuse reflection is not sufficient, and by reflecting light a plurality of times in a diffuse reflection region, light which originally passes through an end portion can be diffused and reflected in a form closer to perfect diffusion. Accordingly, it is considered that total reflection is more efficiently suppressed, whereby the light extraction efficiency can be improved.

Thirdly, by diffusing and reflecting light which propagates from the light-emitting region by the diffuse reflectors 63a and 63b formed on the light exit direction side (air side) of the front substrate 1 and partially returning the light to the light-emitting region, the light can be at least partially returned to the light-emitting region before reaching the side surfaces and can be extracted. In this manner, the effect of absorption by a member when light propagates to the side surfaces of the substrate can be reduced. Accordingly, it is considered that the light extraction efficiency is improved.

Further, as described above, by the diffuse reflectors 63a and 63b formed on the light exit direction side (air side) of the front substrate 1, a new effect shown below can also be obtained.

That is, by diffusing and reflecting light which propagates from the light-emitting region and originally transmits by the diffuse reflective material on the upper surface and allowing the light to reach the diffuse reflective material on the side surface (lower surface), light which passes through the non-light-emitting region to pass through in a non-front surface direction can be extracted from a front surface light-emitting region, and therefore light in a front surface direction useful for a lighting device can be efficiently extracted. Further, by using a white diffuse reflector, a light-emitting amount in an end portion of the light-emitting region continuously comes close to 0, and therefore, the non-light-emitting region whose boundary is not clear can be covered with the white body. Accordingly, light can be extracted without deteriorating the visibility.

In the above-described respective embodiments, the light-emitting region on one principal surface on the light exit surface side of the front substrate 1 may be formed such that it is deformed to have a shape capable of diffusing light. A method for deforming the light-emitting region of the front substrate 1 is not particularly limited, however, for example, surface roughening by sandblast, surface roughening by etching, application of a diffusing layer, adhesion of a diffusing sheet, or the like can be used. By forming the light-emitting region on a principal surface on the light exit surface side of the front substrate 1 on a surface on which light is diffused as described above, in the case where the surface of the front substrate 1 is formed into a specular surface, light reflected at an angle which causes total reflection is diffused, whereby the light can be allowed to exit from the surface of the front substrate 1 so as to improve the light extraction efficiency.

Hereinafter, the invention will be more specifically described with reference to Examples.

Example 1

ITO was deposited by sputtering on a front substrate 1 made of glass with a thickness of 1.1 mm. The resulting glass substrate was cut into a 50-mm square, and the ITO was etched into strips with a width of 2 mm, whereby a transparent electrode 2 (anode) was formed. This front substrate 1 having the transparent electrode 2 formed thereon was ultrasonically cleaned for 15 minutes in acetone, pure water, and isopropyl alcohol, followed by drying and UV-ozone cleaning.

Subsequently, this front substrate 1 having the transparent electrode 2 formed thereon was placed in a vacuum deposition device, and under a reduced pressure of $1.33 \times 10^{-4}$ Pa, 4,4'-bis[N-(naphthyl)-N-phenylamino]biphenyl (α-NPD, manufactured by Dojindo Laboratories Co., Ltd.) was deposited to a thickness of 30 nm at a deposition rate of 0.1 to 0.2 nm/s, whereby a hole transport layer was formed on the transparent electrode 2. Then, an organic light-emitting layer 3 was formed on the hole transport layer by laminating a 10-nm thick layer in which α-NPD was doped with rubrene (manufactured by Acros Organics, Inc.) at 1% by mass as a light-emitting layer and a 50-nm thick layer in which a distyryl biphenyl derivative ("DPVBi" manufactured by Idemitsu Kosan Co., Ltd.) was doped with a DSA derivative having a carbazolyl group at an end ("BCzVBi" manufactured by Idemitsu Kosan Co., Ltd.) at 12% by mass as a blue light-emitting layer. Thereafter, an electron transport layer was formed on the organic light-emitting layer 3 by codepositing bathophenanthroline (manufactured by Dojindo Laboratories Co., Ltd.) and Cs at a molar ratio of 1:1 to a thickness of 200 Å, and subsequently, a counter electrode 4 (cathode) was formed on the electron transport layer by depositing Al at a deposition rate of 1 nm/s to a width of 2 mm and a thickness of 150 nm, whereby an organic light-emitting device with a light-emitting surface with a size of 2 mm×2 mm was produced.

Subsequently, as diffuse reflectors 61a, 61b, 62a, and 62b, a reflection sheet "BS300" manufactured by Keiwa, Inc. was used, and the reflection sheet was adhered to all of the four side surfaces of the front substrate 1 and non-light-emitting regions thereof. Specifically, the diffuse reflectors formed on the side surfaces of the front substrate 1 correspond to the diffuse reflectors 61a and 61b in FIG. 1. Further, the diffuse reflectors formed in the non-light-emitting regions on one principal surface of the front substrate 1 on the side of the organic light-emitting layer 3 correspond to the diffuse reflectors 62a and 62b. The diffuse reflectors 61a and 62a cover one side surface of the front substrate 1, and the diffuse reflectors 61b and 62b cover one side surface different from the above one side surface of the front substrate 1. As an adhesive (not shown), "KZ9752" manufactured by JSR Corporation was used, and the reflection sheets were tightly adhered to the front substrate 1 using the adhesive. In this manner, a sample corresponding to FIG. 1 was produced.

Incidentally, the diffuse reflectance of the reflection sheet "BS300" was measured according to JIS Z 8741 and found to be 90%.

Example 2

A sample corresponding to FIG. 3 was produced by forming diffuse reflectors 63a and 63b in non-light-emitting regions on the light exit surface side of the front substrate 1 of the organic light-emitting device produced in Example 1 using the same material as in Example 1.

Example 3

In place of the front substrate 1 of the organic light-emitting device produced in Example 1, a substrate having a refractive index (nd) at a wavelength of 587.6 nm of 1.6 was used. Specifically, a high-refractive index glass substrate "K-PSK300" manufactured by Sumita Optical Glass Inc. was used. The other configuration was the same as that in Example 1.

Example 4

In place of the front substrate 1 of the organic light-emitting device produced in Example 1, a substrate having a refractive index (nd) at a wavelength of 587.6 nm of 2.0 was used. Specifically, a high-refractive index glass substrate "K-PSFn2" manufactured by Sumita Optical Glass Inc. was used. Incidentally, the refractive index (nd) at a wavelength of 587.6 nm of the light-emitting layer in this configuration was 1.8. Therefore, the device was configured such that the refractive index of the substrate was higher than that of the light-emitting layer. The other configuration was the same as that in Example 1.

Example 5

Al was deposited at a deposition rate of 1 nm/s to a width of 2 mm and a thickness of 150 nm on a back substrate 9 made of glass with a thickness of 1.1 mm and a 50-mm square size, whereby a counter electrode 4 (cathode) was formed. Thereafter, an electron transport layer was formed thereon by codepositing bathophenanthroline (manufactured by Dojindo Laboratories Co., Ltd.) and Cs at a molar ratio of 1:1 to a thickness of 200 Å. Then, a light-emitting layer 3 was formed thereon by laminating a 50-nm thick layer in which a distyryl biphenyl derivative ("DPVBi" manufactured by Idemitsu Kosan Co., Ltd.) was doped with a DSA derivative having a carbazolyl group at an end ("BCzVBi" manufactured by Idemitsu Kosan Co., Ltd.) at 12% by mass as a blue light-emitting layer and a 10-nm thick layer in which α-NPD was doped with rubrene (manufactured by Acros Organics, Inc.) at 1% by mass as a yellow light-emitting layer. Subsequently, a hole transport layer was formed thereon by depositing 4,4'-bis[N-(naphthyl)-N-phenylamino]biphenyl (α-NPD, manufactured by Dojindo Laboratories Co., Ltd.) to a thickness of 30 nm at a deposition rate of 0.1 to 0.2 nm/s under a reduced pressure of $1.33 \times 10^{-4}$ Pa. Finally, IZO was deposited thereon by sputtering. By using a mask, the IZO was patterned into strips with a width of 2 mm, whereby a transparent electrode 2 (anode) was formed. In this manner, an organic light-emitting device with a light-emitting surface with a size of 2 mm×2 mm was produced.

Subsequently, this organic light-emitting device was transferred into a sealing chamber which was kept at a high dew point in a circulating flow of high-purity nitrogen gas without exposing the back substrate 9 having the organic light-emitting element formed thereon to the atmosphere.

Figure 4:
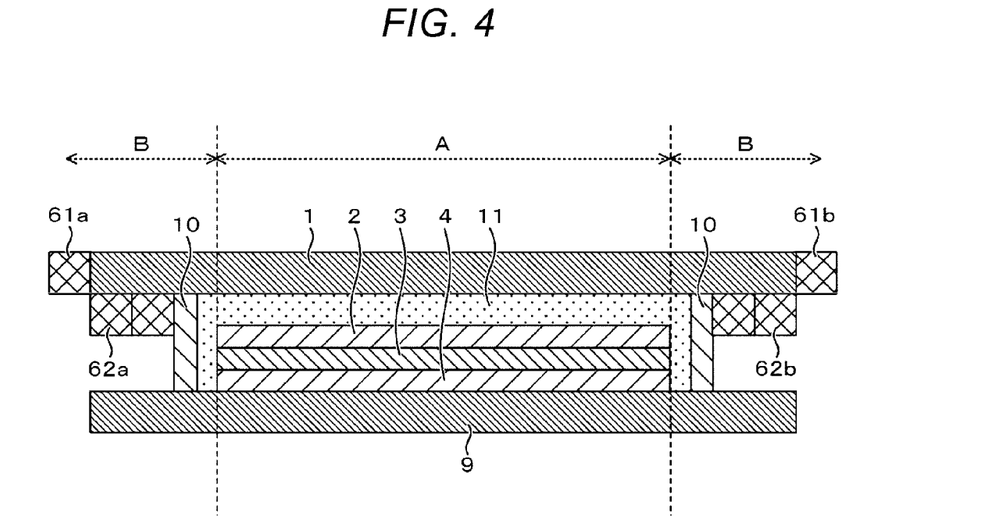
FIG. 4 is a cross-sectional view showing a main part of an exemplary lamination structure of an organic light-emitting device according to an embodiment of the invention.

Subsequently, as diffuse reflectors 61a, 61b, 62a, and 62b, a reflection sheet "BS300" manufactured by Keiwa, Inc. was used, and the reflection sheet was adhered to all of the four side surfaces of a front substrate 1 and non-light-emitting regions thereof. Specifically, the diffuse reflectors formed on the side surfaces of the front substrate 1 correspond to the diffuse reflectors 61a and 61b in FIG. 4. Further, the diffuse reflectors formed in the non-light-emitting regions on one principal surface of the front substrate 1 on the side of the organic light-emitting layer 3 correspond to the diffuse reflectors 62a and 62b. The diffuse reflectors 61a and 62a cover one side surface of the front substrate 1, and the diffuse reflectors 61b and 62b cover one side surface different from the above one side surface of the front substrate 1. As an adhesive (not shown), "KZ9752" manufactured by JSR Corporation was used, and the reflection sheets were tightly adhered to the front substrate 1 using the adhesive.

Then, this front substrate 1 was introduced into the sealing chamber. This front substrate 1 functions as a sealing substrate. A photocurable resin 10 for sealing was drawn in an edge portion of the front substrate 1 such that the resin 10 did not overlap with the diffuse reflectors using a known seal dispenser (not shown). Further, a sealing material 11 (having a refractive index at a wavelength of 587.6 nm of about 1.5) made of an epoxy resin was applied to a portion corresponding to the light-emitting region A of the front substrate 1. Then, the resulting article was introduced into a vacuum bonding device in the sealing chamber, and the front substrate 1 and the back substrate 9 were fitted to each other and bonded to each other by pressing. Subsequently, a known light-shielding plate was placed so as to prevent the exposure of the entire organic light-emitting element of the organic light-emitting device produced by bonding the front substrate 1 to the back substrate 9 to UV light, and UV light was irradiated from the side of the front substrate 1, and the photocurable resin 10 was cured. In this manner, a sample having a top-emission type structure corresponding to FIG. 4 was produced.

Example 6

A sample corresponding to FIG. 1 was produced using a reflection sheet "Lumira E6SR" manufactured by Toray Industries, Inc. in place of the material of the diffuse reflectors of the organic light-emitting device produced in Example 1.

Incidentally, the diffuse reflectance of the reflection sheet "Lumira E6SR" was measured according to JIS Z 8741 and found to be 95%.

Example 7

A reflection sheet "BS300" manufactured by Keiwa, Inc. was used as diffuse reflectors 64a, 64b, 65a, and 65b for the back substrate 9 of the organic light-emitting device produced in Example 5, and the reflection sheet was adhered to all of the four side surfaces of the back substrate 9 and non-light-emitting regions thereof. Specifically, the diffuse reflectors formed on the side surfaces of the back substrate 9 correspond to the diffuse reflectors 64a and 64b in FIG. 5. Further, the diffuse reflectors formed in the non-light-emitting regions on one principal surface of the back substrate 9 on the opposite side to the organic light-emitting layer 3 side correspond to the diffuse reflectors 65a and 65b. The diffuse reflectors 64a and 65a cover one side surface of the back substrate 9, and the diffuse reflectors 64b and 65b cover one side surface different from the above one side surface of the back substrate 9. As an adhesive (not shown), "KZ9752" manufactured by JSR Corporation was used, and the reflection sheets were tightly adhered to the back substrate 9 using the adhesive. In this manner, a sample corresponding to FIG. 5 was produced.

Example 8

IZO was deposited by sputtering on a front substrate 1 made of PET (having a refractive index at a wavelength of 587.6 nm of about 1.5) with a thickness of 0.3 mm. The resulting front substrate was cut into a 50-mm square, and the IZO was patterned using a mask and a transparent electrode 2 (anode) was formed into strips with a width of 2 mm. This front substrate 1 having the transparent electrode 2 formed thereon was ultrasonically cleaned for 15 minutes in pure water, followed by drying. Subsequently, this front substrate 1 having the transparent electrode 2 formed thereon was placed in a vacuum deposition device, and under a reduced pressure of $1.33 \times 10^{-4}$ Pa, 4,4'-bis[N-(naphthyl)-N-phenylamino]biphenyl (α-NPD, manufactured by Dojindo Laboratories Co., Ltd.) was deposited to a thickness of 30 nm at a deposition rate of 0.1 to 0.2 nm/s, whereby a hole transport layer was formed on the transparent electrode 2. Then, an organic light-emitting layer 3 was formed on the hole transport layer by laminating a 10-nm thick layer in which α-NPD was doped with rubrene (manufactured by Acros Organics, Inc.) at 1% by mass as a light-emitting layer and a 50-nm thick layer in which a distyryl biphenyl derivative ("DPVBi" manufactured by Idemitsu Kosan Co., Ltd.) was doped with a DSA derivative having a carbazolyl group at an end ("BCzVBi" manufactured by Idemitsu Kosan Co., Ltd.) at 12% by mass as a blue light-emitting layer. Thereafter, an electron transport layer was formed on the organic light-emitting layer 3 by codepositing bathophenanthroline (manufactured by Dojindo Laboratories Co., Ltd.) and Cs at a molar ratio of 1:1 to a thickness of 200 Å, and subsequently, a counter electrode 4 (cathode) was formed on the electron transport layer by depositing Al at a deposition rate of 1 nm/s to a width of 2 mm and a thickness of 150 nm, whereby an organic light-emitting device with a light-emitting surface with a size of 2 mm×2 mm was produced.

Subsequently, this organic light-emitting device was introduced into a sealing chamber. Then, a sealing material 11 made of an epoxy resin containing a curing agent was applied to a portion corresponding to the light-emitting region A of the front substrate 1 using a known dispenser. Thereafter, the resulting article was introduced into a vacuum bonding device in the sealing chamber, and the front substrate 1 and the back substrate 9 (made of PET) were fitted to each other and bonded to each other by pressing. At a portion where the front substrate and the back substrate are in contact with each other, thermal press-bonding was performed as needed. Finally, the sealing material was thermally cured in a thermostat bath at 80° C., whereby sealing was completed.

Subsequently, as diffuse reflectors 66a, 66b, 67a, and 67b, a reflection sheet "BS300" manufactured by Keiwa, Inc. was used, and the reflection sheet was adhered to all of the four side surfaces of the front substrate 1 and the back substrate 9 and non-light-emitting regions of the back substrate. Specifically, the diffuse reflectors formed on the side surfaces of the front substrate 1 and the back substrate 9 correspond to the diffuse reflectors 66a and 66b in FIG. 6. Further, the diffuse reflectors formed in the non-light-emitting regions on one principal surface of the back substrate 9 on the opposite side to the organic light-emitting layer 3 side correspond to the diffuse reflectors 67a and 67b. The diffuse reflectors 66a and 67a cover one side surface of the front substrate 1 and the back substrate 9, and the diffuse reflectors 66b and 67b cover one side surface different from the above one side surface of the front substrate 1 and the back substrate 9. As an adhesive (not shown), "KZ9752" manufactured by JSR Corporation was used, and the reflection sheets were tightly adhered to the front substrate 1 and the back substrate 9 using the adhesive. In this manner, a sample corresponding to FIG. 6 was produced.

Comparative Example 1

The organic light-emitting device produced in Example 1 corresponding to FIG. 1 was used as such without forming the diffuse reflectors 61a, 61b, 62a, and 62b.

Each of the organic light-emitting devices of Examples 1 to 8 and Comparative Example 1 described above was allowed to emit light by connecting the device to a power supply (Keithley 2400) and applying a voltage of 4.5 V thereto. A front luminance at this time was measured by a luminance colorimeter ("BM-5A" manufactured by Topcon Technohouse Corporation, viewing angle: 0.1°, measurement distance: 45 cm), and the evaluation thereof was performed. The results are shown in Table 1.

TABLE 1

|  | Front luminance (cd/m²) | Diffuse reflectance (%) | Refractive index of front substrate |
| --- | --- | --- | --- |
| Comparative Example 1 | 500 | — | 1.5 |
| Example 1 | 820 | 90 | 1.5 |
| Example 2 | 840 | 90 | 1.5 |
| Example 3 | 1220 | 90 | 1.6 |
| Example 4 | 1600 | 90 | 2.0 |
| Example 5 | 890 | 90 | 1.5 |
| Example 6 | 1020 | 95 | 1.5 |
| Example 7 | 920 | 90 | 1.5 |
| Example 8 | 900 | 90 | 1.5 |

As can be seen in Table 1, it was confirmed that the device of each of the Examples in which the diffuse reflectors were provided on the front substrate 1 or the back substrate 9 could exhibit a higher front luminance than the device of Comparative Example 1 in which the diffuse reflector was not provided, and light extraction efficiency was improved.

In Examples 1 and 2, it is considered that the front luminance was improved for the reason described in the above embodiment. Further, by adhering the diffuse reflectors using an adhesive, the productivity of the organic light-emitting device was improved and the organic light-emitting device could be more simply and efficiently produced as compared with the case where the diffuse reflectors were formed by a film forming method or the like.

In Examples 3 and 4, it is considered that by increasing the refractive index of the front substrate 1, also light trapped in the transparent electrode 2 or the organic light-emitting layer 3 in the related art could be extracted to the front substrate, and moreover, by providing the diffuse reflectors according to this configuration, light introduced into the front substrate could be efficiently extracted to the air side, and therefore, a high front luminance could be obtained. Particularly in Example 4, it is considered that since the refractive index of the front substrate 1 was set higher than that of the light-emitting layer, almost all of the propagating light generated in the light-emitting layer could be extracted to the air side, and therefore, a particularly high front luminance could be obtained.

In Example 5, it is considered that by forming the device having a top-emission type structure using the sealing material made of a resin, light introduced into the front substrate could be efficiently extracted to the air side due to the effect of the invention even though the device did not have a bottom-emission structure as in Example 1, and a high front luminance could be obtained. The sealing material has a function of introducing light into the front substrate. If this sealing material is not provided, the total reflection occurs at the interface between the transparent electrode and air, and even light trapped in the front substrate in Comparative Example 1 cannot be introduced into the front substrate 1 and, and therefore, light cannot be efficiently extracted to the air side.

Incidentally, the sealing material is preferably made of a resin from the viewpoint of stress relaxation and forming process. Examples of the resin material include photocurable adhesive resins, thermosetting adhesive resins, and two-liquid curable adhesive resins, each containing an epoxy resin, an acrylic resin, a silicone resin, or the like, and acrylic resins such as ethylene ethyl acrylate (EEA) polymers, vinyl resins such as ethylene vinyl acetate (EVA), thermoplastic resins such as polyamides and synthetic rubbers, and thermoplastic adhesive resins such as acid-modified products of polyethylene or polypropylene. Examples of a method for forming such a sealing material include a solvent solution method, an extrusion lamination method, a fusion/hot melt method, a calender method, a discharge jet application method, a screen printing method, a vacuum lamination method, and a heated roll lamination method. If necessary, a material having a water absorption property or an oxygen absorption property can also be contained therein. The thickness of the resin layer to be formed on the sealing material is arbitrarily determined depending on the size or shape of the organic EL element to be sealed, but is preferably from about 5 to 1000 μm.

In Example 6, it is considered that by increasing the reflectance of the diffuse reflectors, light could be allowed to exit to the air side before light energy was lost due to absorption loss accompanying the internal propagation in the front substrate 1, and therefore, the effect of the invention was enhanced, and light introduced into the front substrate could be efficiently extracted to the air side, and as a result, a high front luminance could be obtained.

Figure 5:
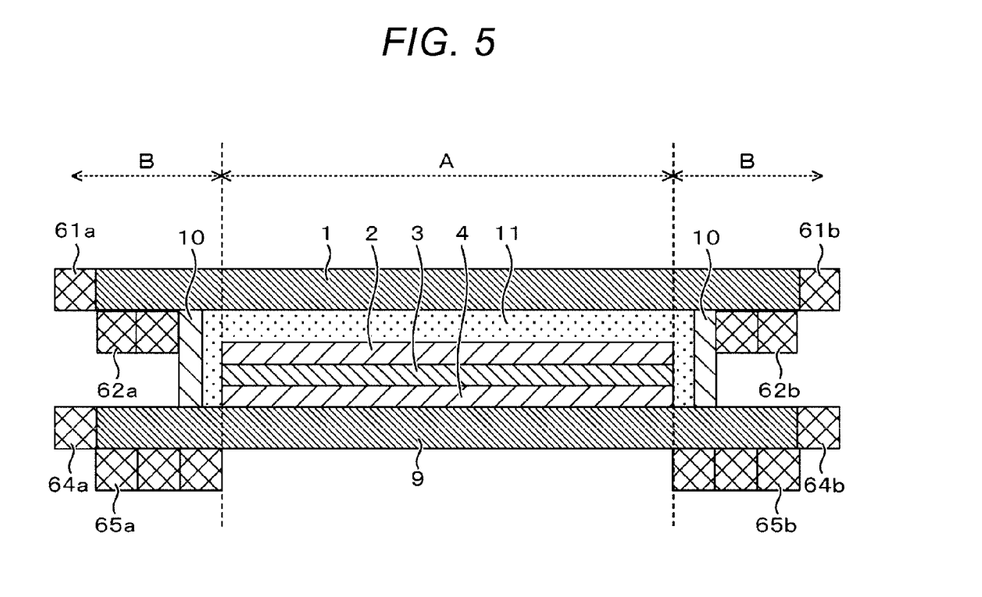
FIG. 5 is a cross-sectional view showing a main part of an exemplary lamination structure of an organic light-emitting device according to an embodiment of the invention.

In Example 7, it is considered that since the diffuse reflectors 64a, 64b, 65a, and 65b prevented light propagating on the side of the back substrate 9 through the sealing material 11, the photocurable resin 10, etc. from releasing on the back surface side (opposite side to the light exit side) of the organic light-emitting device, the effect of the invention was enhanced, and light introduced into the front substrate could be efficiently extracted to the air side, and as a result, a high front luminance could be obtained.

Figure 6:
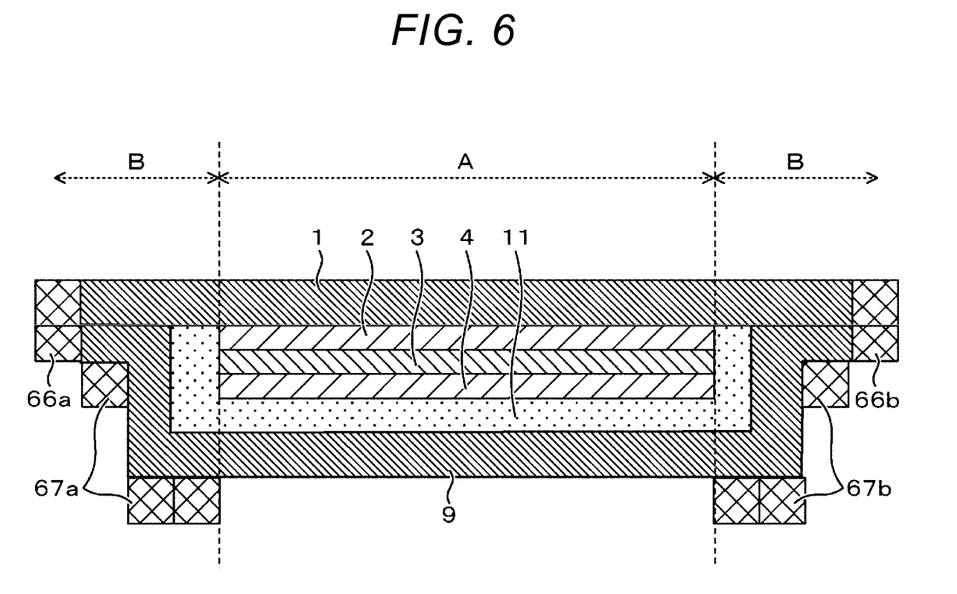
FIG. 6 is a cross-sectional view showing a main part of an exemplary lamination structure of an organic light-emitting device according to an embodiment of the invention.

In Example 8, it is considered that since the diffuse reflectors 66a, 66b, 67a, and 67b diffused and reflected light propagating in the front substrate 1 and the back substrate 9, each having a refractive index of about 1.5 and in the resin material 11 and lost from a side surface, etc. and a back surface, etc. and returned the light to the inside of the organic light-emitting device also in the case of using the front substrate 1 and the back substrate 9, both of which were made of PET having flexibility, due to the effect of the invention, light introduced into the front substrate could be efficiently extracted to the air side, and therefore, a high front luminance could be obtained.

What is claimed is:

1. An organic light-emitting device, comprising:
   a transparent electrode;
   a counter electrode;
   a light-emitting layer interposed between the transparent electrode and the counter electrode;
   a front substrate which allows light from the light-emitting layer to exit to the outside from a surface of the front substrate on the opposite side to the light-emitting layer side; and
   a diffuse reflector which reflects light from the light-emitting layer, wherein
   the diffuse reflector includes a first diffuse reflector which covers a side surface of the front substrate and a second diffuse reflector which covers a non-light emitting region on a surface of the front substrate on the light-emitting layer side.

2. The organic light-emitting device according to claim 1, wherein the first diffuse reflector and the second diffuse reflector each have a diffuse reflectance of 90% or more.

3. The organic light-emitting device according to claim 1, wherein the first diffuse reflector and the second diffuse reflector each have a diffuse reflectance of 95% or more.

4. The organic light-emitting device according to claim 1, wherein the diffuse reflector further includes a third diffuse reflector which covers a non-light emitting region on a surface of the front substrate on the opposite side to the light-emitting layer side.

5. The organic light-emitting device according to claim 4, wherein the third diffuse reflector has a diffuse reflectance of 90% or more.

6. The organic light-emitting device according to claim 1, wherein the front substrate has a refractive index at a wavelength of 587.6 nm of 1.6 or more.

7. The organic light-emitting device according to claim 1, wherein the refractive index at a wavelength of 587.6 nm of the front substrate is more than that of the light-emitting layer.

8. The organic light-emitting device according to claim 1, wherein a sealing material is disposed between the front substrate and the transparent electrode.

9. The organic light-emitting device according to claim 1, wherein an adhesive is disposed between the front substrate and the diffuse reflector.

10. The organic light-emitting device according to claim 1, wherein
    a back substrate is disposed on the opposite side to the front substrate side in relation to the light-emitting layer,
    the diffuse reflector further includes a fourth diffuse reflector which covers a side surface of the back substrate and a fifth diffuse reflector which covers a non-light emitting region on a surface of the back substrate on the opposite side to the light-emitting layer side.

* * * * *